United States Patent
Rosenband et al.

(10) Patent No.: US 8,500,844 B2
(45) Date of Patent: Aug. 6, 2013

(54) PROCESS FOR PRODUCING POWDERS OF GERMANIUM

(75) Inventors: Valery Rosenband, Haifa (IL); Eric L. Granstrom, Andover, MN (US); Lorenzo Mangolini, Riverside, CA (US)

(73) Assignee: Cima NanoTech Israel Ltd., Caesarea (IL)

( * ) Notice: Subject to any disclaimer, the term of this patent is extended or adjusted under 35 U.S.C. 154(b) by 188 days.

(21) Appl. No.: 12/991,836

(22) PCT Filed: May 7, 2009

(86) PCT No.: PCT/US2009/043148
§ 371 (c)(1),
(2), (4) Date: May 3, 2011

(87) PCT Pub. No.: WO2009/137680
PCT Pub. Date: Nov. 12, 2009

(65) Prior Publication Data
US 2011/0281421 A1    Nov. 17, 2011

Related U.S. Application Data

(60) Provisional application No. 61/051,968, filed on May 9, 2008.

(51) Int. Cl.
*B22F 9/20* (2006.01)
*C22B 41/00* (2006.01)

(52) U.S. Cl.
USPC ............................................. 75/364; 75/689

(58) Field of Classification Search
None
See application file for complete search history.

(56) References Cited

U.S. PATENT DOCUMENTS

| 3,505,107 | A |   | 4/1970 | Gleim |
| 4,377,564 | A |   | 3/1983 | Dahlberg |
| 4,385,915 | A | * | 5/1983 | Amelse et al. ................. 65/413 |
| 5,420,845 | A | * | 5/1995 | Maeda et al. ................. 369/100 |
| 5,442,978 | A |   | 8/1995 | Hildreth et al. |
| 6,337,057 | B1 | * | 1/2002 | Bohrer et al. ................... 423/96 |
| 6,653,552 | B2 | * | 11/2003 | Sugawara et al. ............. 136/250 |
| 2004/0173948 | A1 |   | 9/2004 | Pandelisev |
| 2005/0145163 | A1 |   | 7/2005 | Matsuki et al. |
| 2006/0112785 | A1 |   | 6/2006 | Garbar et al. |
| 2008/0026220 | A9 |   | 1/2008 | Bi et al. |
| 2009/0010833 | A1 |   | 1/2009 | Rozenband et al. |

OTHER PUBLICATIONS

International Preliminary Report on Patentability; Nov. 18, 2010; World Intellectual Property Organization (WIPO) (International Bureau of); PCT/US2009/043148; 7 pages.

International Search Report and Written Opinion; Jun. 29, 2009; World Intellectual Property Organization (WIPO) (International Bureau of); PCT/US2009/043148; 7 pages.

Bao et al., "Chemical reduction of three-dimensional silica microassemblies into microporous silicon replicas," *Nature*, 2007, 446:172-175.

Cai et al., "Three-Dimensional Magnesia-Based Nanocrystal Assemblies via Low-Temperature Manesiothermic Reaction of Diatom Microshells," *J Am Ceram Soc.*, 2005, 88(7):2005-2010.

Nersisyan et al., "A study of tunsten nanopowder formation by self-propagating high-temperature synthesis," *Combustion and Flame*, 2005, 142:241-248.

Sandhage et al., "Novel, Bioclastic Route to Self-Assembled, 3D, Chemically Tailored Meso-Nanostructures: Shape-Preserving Reactive Conversion of Biosilica (Diatom) Microshells," *Adv. Mater.*, 2002, 14(6):429-433.

Woong et al., "Preparation of High Purity Si Powder from SiO2 by Self-Propagating High-Temperature Synthesis Process," *J Kor Inst Met Mater.*, 2000, 38(1):105-111 (English Abstract).

* cited by examiner

*Primary Examiner* — George Wyszomierski (74) *Attorney, Agent, or Firm* — Fish & Richardson P.C.

(57) ABSTRACT

A method of producing a powder of crystalline germanium.

20 Claims, 6 Drawing Sheets

Fig 1  GeO$_2$ + 2Mg -> Ge + 2MgO

Fig 2  GeO$_2$ + 2Mg + n NaCl -> Ge + n NaCl

Fig 3  GeO$_2$ + 2Mg + n MgO -> Ge + (2+n) MgO

PROCESS FOR PRODUCING POWDERS OF GERMANIUM

CROSS-REFERENCE TO RELATED APPLICATIONS

This application is a National Stage application under 35 U.S.C. §371 and claims benefit under 35 U.S.C. §119(a) of International Application No. PCT/US2009/043148, having an International Filing Date of May 7, 2009, which claims priority under 35 USC §119(e) to U.S. Provisional Application Ser. No. 61/051,968, filed on May 9, 2008, the entire contents of which are hereby incorporated by reference.

TECHNICAL FIELD

This invention relates to the field of germanium semiconductors and, more specifically, to a process for making germanium powder.

BACKGROUND

Semiconductor materials are needed in many electronic devices. They are present in many active devices such as diodes, transistors, light-emitting diodes (LEDs), sensors, thin film transistors (TFTs), integrated circuits, smart cards, smart toys, displays, radio frequency identification (RFID) tags, solar cells, organic electroluminescence (EL) devices, etc.

Active devices and semiconductor layers are generally made today by complicated, expensive, capital-intensive methods (lithographic, vacuum deposition, and etching techniques). Most of these devices are made of several layers. A more convenient, flexible and cheaper way of making these devices is to transport molecules and materials in solutions (as in biological systems) to create the desired architecture. The transfer of the materials through liquids to the desired place can be achieved by common printing methods (flexographic, gravure, ink jet and others) enabling printed electronics. Printed electronics offer many advantages including lower capital costs, fewer barriers to low and high volume production (depending on the printing method), and the possibility of local manufacture.

The ability to print semiconductor layers opens a wide range of new applications and designs, as well as enabling the production of a wide range of devices on flexible and inexpensive substrates. Printing methods, along with the availability of suitable printable materials, will eventually enable the printing of semiconductor layers in much the same way as newspapers are printed today by high-speed printing presses.

To enable semiconductor printing, suitable semiconductor inks must be developed. Most of the present work relating to semiconductor inks is based on organic semiconductors because they can be processed in liquid form and therefore formulated into printing inks.

Organic semiconductors are much more resistive, i.e., less conductive, and less stable than common inorganic semiconductors such as crystalline silicon or germanium. One method of comparing semiconductor performance in, for example, a transistor, is to measure what is known as field-effect mobility, also referred to herein as simply "mobility" or "electron mobility." This is a measure of how fast a charge will move in a material with a certain electric field. Stated in centimeters squared per volt per second ($cm^2$/V-s), field effect mobility is an important factor, for instance, in determining the speed at which a transistor will turn on and off. Crystalline silicon, for example, has a mobility of 1450 $cm^2$/V-s, and crystalline germanium a mobility of 3900 $cm^2$/Vs. Amorphous silicon semiconductors can achieve mobilities of only around 0.1 $cm^2$/V-s, and organic semiconductors have electron mobilities of only about 0.2 $cm^2$/V-s, and in very controlled environments can achieve 2.0 $cm^2$/V-s (e.g. pentacene). Thus, the mobility of crystalline inorganic semiconductors such as silicon and germanium in these devices is orders of magnitude better than that of organic semiconductors and amorphous silicon, and the ability to formulate semiconductor inks with crystalline germanium would result in transistors and other electronic devices having much better performance and more widespread applicability than semi-conductor inks formulated with organic semiconductors.

Germanium is of particular use in a variety of infrared electronics applications. Alloys of SiGe are also of use. Additionally, hybrid circuits containing Si portions and Ge portions are of use, for instance in photovoltaic devices.

Processing germanium containing materials to produce large single crystal samples is a very energy-intensive and expensive process.

Newer methods have been developed to produce crystalline germanium particles and films at lower costs, but none has been successfully used for large scale production. Prior to the present invention, a need existed for a simple, energy-efficient, scalable process for producing crystalline germanium powder and powders that could be processed into printable inks.

SUMMARY

Disclosed herein is a method for producing a powder of germanium comprising the steps of (a) forming a mixture comprising a germanium precursor powder, such as germanium oxide (i.e. germania, $GeO_2$), and a second powder that will generate an exothermic reaction when heated; (b) heating the mixture in a closed reactor to a temperature at which the exothermic reaction occurs; (c) treating the reaction mixture with a leaching agent to leach unwanted materials from the reaction mixture; and (d) isolating the crystalline germanium powder.

A further embodiment of the process relates to making fine, ultrafine, or nanoscale powders of germanium. The terms fine, ultrafine, and fine powders may be used here to describe powders comprised of materials generally having at least one dimension smaller than 1 mm, 1 micrometer, and 100 nm, respectively.

A further embodiment of the process relates to making powders of crystalline germanium.

A further embodiment of the process relates to the inclusion of additional materials in the reaction mixture, such as inert materials, to control the reaction temperature or heat dissipation as well as preventing particle agglomeration and providing particle protection and stabilization.

Another embodiment of the process relates to the inclusion of doping materials in the reaction mixture, for instance to increase the conductivity of the resulting crystalline germanium powder.

Another embodiment of the process relates to maintaining the temperature of the reaction in step (b) below the melting temperature of the crystalline germanium powder.

Another embodiment relates to a method for producing a fine powder of crystalline germanium comprising the steps of (a) forming a mixture comprising germanium dioxide and magnesium powder; (b) heating the mixture in a closed reactor under inert gas to a temperature at which an exothermic reaction occurs while maintaining the temperature of the reaction below the melting temperature of the crystalline germanium product; (c) treating the reaction mixture with a leaching agent to leach unwanted materials from the reaction mixture; and (d) isolating the crystalline germanium powder.

The above summary is not intended to describe each disclosed embodiment or every implementation of the present invention. The Figures and the detailed description that follow more particularly exemplify illustrative embodiments.

DETAILED DESCRIPTION

Described herein is a process for producing a powder of germanium. The process is capable of producing crystalline germanium powder in particles with sizes <100 nm through >10 um in size.

Applicants have discovered that such powders can be produced by a process that utilizes self-propagating high-temperature synthesis (SHS). SHS is a combustion-driven material synthesis technique that has been used to form various metallic, ceramic and composite materials. The process is carried out in a reaction vessel (e.g., a closed reaction vessel) and generally under an inert gas to prevent oxidation of the final product during or after synthesis. The reaction process is initiated by either locally igniting a powder mixture using a heated wire, electric spark, laser beam, etc., or by heating the entire mixture to some elevated temperature at which a "thermal explosion" occurs. Either method produces a chemical reaction that is sufficiently exothermic to sustain a combustion wave that coverts the reactant powder into the desired product. The thermal explosion method is the preferred method of carrying out the process.

According to the process, the first step involves forming a powder mixture. One ingredient of the mixture is a powder of a germanium precursor. The germanium precursor is preferably germanium dioxide, GeO2. Other germanium precursors may be used. In general, smaller particle size germanium precursor particles are preferred.

Figure 1:
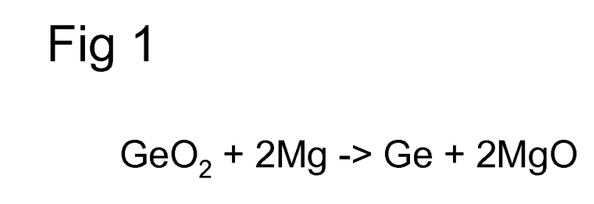
FIG. 1 is an illustrative schematic reaction of one embodiment of the process of the invention.

The other ingredient is a material that will generate an exothermic reaction with the germanium precursor when heated. The preferred second ingredient is magnesium powder and the schematic reaction is shown in FIG. 1. Magnesium may be substituted by other materials, for example aluminum or calcium.

The germanium precursor powder and the other ingredient powder are mixed thoroughly to form a uniform mixture. Ball milling for several hours works well to produce a uniform mixture, although other conventional methods of mixing powders also can be used. Preferably, the mixing is carried out prior to heating the ingredients.

The mixture is heated to a temperature at which an exothermic reaction occurs. The heating process may be performed in many different configurations provided that enough energy is incorporated and the energy density is achieved in the reaction mixture to enable the SHS process to proceed. The parameters to be considered for this purpose include, but are not limited to, temperature profile, geometry of the oven or crucible, heating elements inside and outside the oven, material mass and volume, mixing method and mode, temperature range in the initiation step, and energy source (heater, electric furnace, induction, hot filaments, dissipated energy, etc).

In general, the process will proceed if the temperature of one solid component achieves its melting point. In the case of the reaction illustrated in FIG. 1, the melting point of magnesium in the Mg/GeO$_2$ system is 650° C., and heating the mixture to a temperature near or above this temperature should insure that the reaction will proceed.

The reaction products, properties and purity are generally optimized when the combination of initial temperature and composition of materials is such that the peak temperature achieved by the reacting materials is less than the melting point of the desired product but sufficiently high to result in a self-propagating reaction front. This is particularly true if nano-size powder is desired. Temperature conditions can be modified by the geometry of the crucible (reactor) where there is significant heat dissipation from the reaction mixture to the crucible during the reaction. Additional cooling elements or heat dissipation devices can be added to the crucible (reactor). The material can also be mixed during the reaction by mixing techniques such as providing external agitation, stirring, stirring with mixer, introducing a stream of gas through the material, fluidized bed, rolling the crucible (reactor), tumbling, rotary kiln (cement), roll mill, batch and continuous process screw, insulating walls, fractionation of the product, extrusion and others.

Another method of controlling the reaction temperature is to add inert materials to the reaction mixture. The range of inert materials that can be used is wide, and includes materials such as elemental metals, oxides of metals, inorganic salts of the metals (chlorides, sulfides, nitrates, etc.) and others. The selection must be made such that the material does not react with the other reactants, and the inert material can be easily washed or leached from the reaction mixture after the reaction is complete. In the Mg/GeO$_2$ reaction system, temperature can also be controlled by adding excess magnesium.

Figure 2:
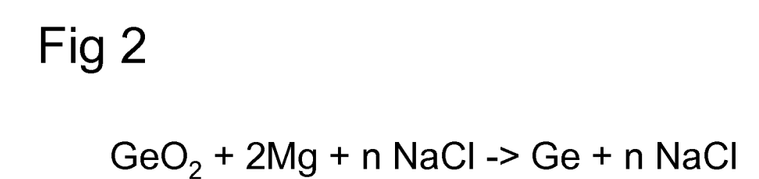
FIG. 2 is an illustrative schematic reaction of another embodiment of the process of the invention.
Figure 3:
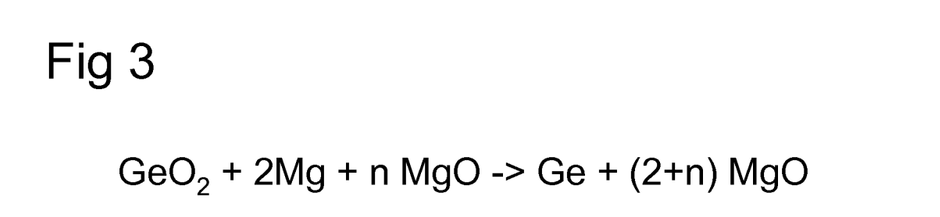
FIG. 3 is an illustrative schematic reaction of another embodiment of the process of the invention.

In the GeO$_2$/Mg reaction system, NaCl may be particularly effective to lower the temperature reached during the reaction process. The schematic of this reaction is shown in FIG. 2. The higher the amount of NaCl added, the lower the temperature reached in the process. Another preferred inert material for controlling the temperature of the reaction is magnesium oxide MgO. MgO is also a product of the reaction as shown in the reaction schemes of FIGS. 1 and 2, so it avoids the introduction of contaminants such sodium and chloride ions. The reaction scheme for this reaction where MgO is included in the initial reaction mixture is shown in FIG. 3.

After the reaction is complete, and preferably after the temperature has been reduced, the unwanted products of the reaction and any inert materials and other impurities are removed by a washing or leaching process. The leaching process is actually a process in which materials are dissolved. It is preferable to dissolve only or mainly undesired products and un-reacted materials and impurities. This process may be performed in one step or several steps and may be repeated to achieve higher purity. For example, inert NaCl can be washed out with water. Excess MgO can be leached by acids (HCl, acetic acid or any suitable acid, e.g., $MgO+2HCl=MgCl_2+H_2O$). Excess magnesium can be leached by acids (HCl, acetic acid or any suitable acid, e.g., $Mg+2HCl=MgCl_2+H_2$). Excess germania can be leached by HCl and $H_2O$.

Electrical properties of semiconductors are very sensitive to the presence of impurities. Impurities can have beneficial or adverse influence on the material properties. For example, the conductivity of germanium can be changed by addition of very low concentrations of doping materials. Very low concentrations, even in the ppm level, can have this effect. In order to use the germanium powder in semiconductor applications, special care is generally taken to avoid the presence of uncontrolled and/or undesired impurities. Most methods known and applied in the semiconductor industry and wafer production may be applied to the germanium powder or in the process of making it to reduce the presence of impurities.

Several approaches can be implemented to maximize the purity of the crystalline germanium powder. Purification steps can be applied to the final deposited material or to any step between the production of the raw materials up to the deposition step, as described below.

Use of very pure starting materials will decrease the amount of uncontrolled impurities in the material made. The materials used in the production process, may be purified in an earlier stage. Magnesium may be made by electrolysis of very pure magnesium carbonate or by any other suitable production method with pure reactants. It is desirable that the surface of the magnesium or metal powder used in the process be clean of organics. The same is true for all other materials such as $GeO_2$, the inert material, HF, HCl, deionized water and all other reactants and materials involved in the production process.

Furthermore, to obtain very pure materials it is possible to use pure magnesium oxide crucibles, or crucibles made of inert materials that won't introduce impurities into the fine powder produced.

The particles or the deposited patterns can be exposed to different cleaning methods. Such methods may be washing or exposure to cleaning liquids or solutions, or also gas materials with cleaning properties. Examples of liquids and solutions may be those applied in the standard wet cleaning processes used in the semiconductor wafer industry. Gases may be used to clean the materials. Additional methods may be dry cleaning, plasma based methods, use of chelating agents in the solutions, ozone, cryogenic aerosol cleaning, and others.

To clean the surface of the particles any dissolving method capable of cleaning the surface may be used. Usually impurities in the production process are unreacted materials and the inert material. Also, some undesirable reaction products as well as other undesirable materials may be present. The above methods can be used and also any dissolving method capable of cleaning these materials.

The oxide layer on the germanium particles may be considered an undesired impurity and cleaned or reduced by one or a combination of cleaning processes. Also, the oxidation step can be used to purify the particles by inducing diffusion of impurities, capturing impurities which will be cleaned when the layer is cleaned, oxidizing the impurities together with the germanium and increasing the solubility and/or reactivity of the impurities in the different cleaning solutions.

The cleaning process may also be performed with the assistance of additional methods to control it, to enhance the efficiency or for any other reason. These methods may include ultrasonic baths, ultrasonic probes, megasonic energy-generating devices, and stirring devices.

Cleaning methods may be applied alone or in combination with other cleaning methods. Preferably, the purification steps are repeated to achieve the highest purity.

Cleaning conditions used may be any temperature, pressure, liquid and solution concentrations, etc. that won't damage the particles and their properties and preferably, in a safe mode and safety environment. These will include hoods, wet sinks housed in hoods, in manual or automatic set ups (robots). The cleaning process may be performed by immersing the materials in the liquids or solutions, by spraying them, with and without scrubbing, brushing, etc.

After the cleaning process several routes are possible, including water cleaning, heat drying, room temperature drying, air drying, IR drying, vacuum drying, spin drying, isopropyl alcohol vapor drying, etc.

A preferred approach to obtaining very pure material is to reduce the oxide layer on the surface. This can be achieved by a number of methods including, selective reduction, and performing the reaction and storing the material in inert atmospheres.

The processes described above may or may not be followed by additional steps such as particle protection (e.g. surface termination or passivation, storing the material in protective liquid or inert atmosphere and any other suitable method).

To change the electrical properties of the powder, p or n dopant materials such as, for example, boron, aluminum, gallium, indium, phosphorous, arsenic, antimony, and the like may be added to the powder. Doping can be performed at any step of the process. It can be performed in the reaction step by introducing dopants through the raw materials and or through the inert material or reactor material. The dopants may be introduced in the process of manufacturing the raw materials, as oxides, precursors, as solutions or solids, etc. The doping process may also be performed by exposing the reaction mixture in the oven (crucible), or after production by exposing the particles or the deposited pattern to doping material gas, solutions, precursors, etc.

In order to prepare compositions of the crystalline germanium powder that can be printed or coated onto substrates, the powder must be dispersed in a suitable liquid carrier.

The invention is further illustrated by the following non-limiting examples. Ingredients used in the examples are identified in the following table.

| Name | Description | Chemical Name | Grade | Supplier | Remarks |
|---|---|---|---|---|---|
| Germanium Oxide | Powder | GeO2 | 99.998% | Sigma Aldrich | Cat#199478 |
| Magnesium | Light grey powder | Mg | 99% | Sigma Aldrich | Cat#13112 |
| Hydrochloric acid | 37% in H2O | HCl | ACS reagent | Sigma Aldrich | Cat#258148 |
| Water | Distilled Water | H2O | | | |
| Argon | Gas | Ar | 99.998% | Oxygen Service | High Purity |
| Magnesium Oxide | Powder | MgO | 99% | Sigma Aldrich | Cat#342793 |

Example 1

Germanium oxide (1.0 g) was mixed overnight in a ball mill with 0.47 g of magnesium and 2.7 g of magnesium oxide (molar ratio GeO$_2$:Mg:MgO=1:2:8), in a reaction similar to that described in FIG. 3. The mixture was baked at 350° C. for 30 mins in a quartz vessel, and evacuated and purged with Ar to remove residual absorbed powder. The mixture was then heated in a quartz crucible in an argon flow in a closed reactor to 700° C. The reactor was allowed to cool at a rate of approximately 30° C./min to room temperature. Approximately 2.98 g of material were recovered. This product was leached in an approximately 10% solution of HCl in water. The result was centrifuged and separated, and further treated with HCl. The product was then filtered through a 5 um PVDF filter and redispersed using methanol to remove the product from the filter, and left in a vacuum oven overnight to remove methanol. Approximately 0.4 g of black/dark brown powder resulted. Of the resultant 2.98 g product, this leads to a mass yield of Ge of approximately 75%.

Ge powder was deposited from the methanol dispersion described on to a Si wafer that had previously had a SiO2 layer thermally grown atop it for xray diffraction (XRD) analysis and SEM imaging. Powder was also similarly deposited on a conventional carbon TEM grid. After deposition, but prior to imaging, samples were maintained in a N$_2$ environment to prevent aggressive particle oxidation.

Figure 4:
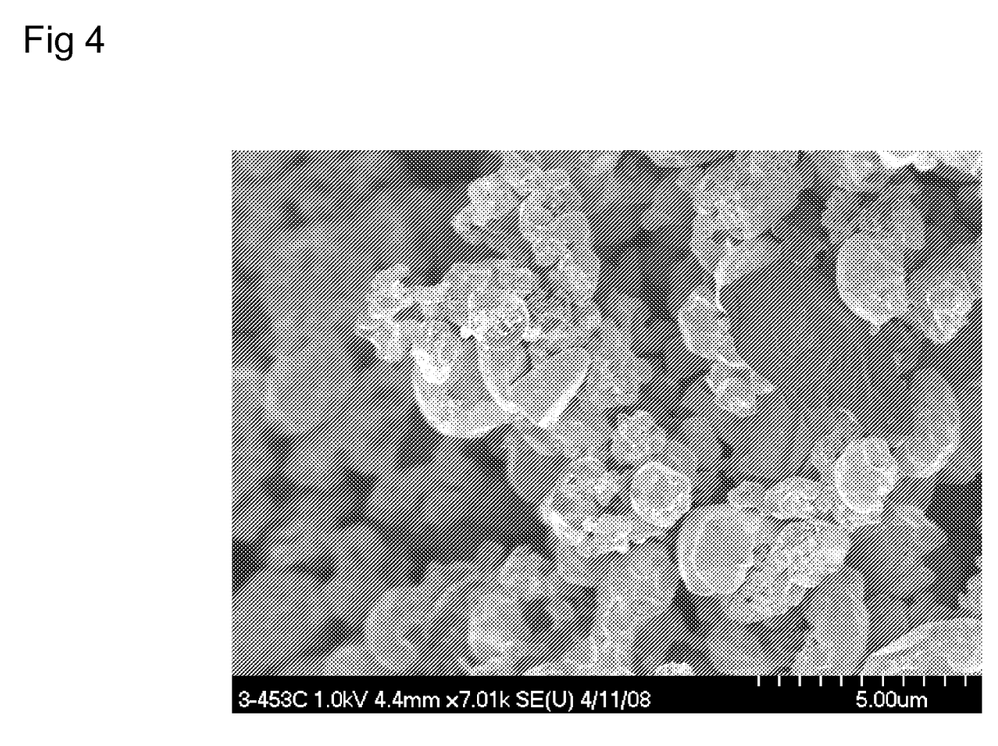
FIG. 4 is an SEM of the crystalline germanium powder produced as described in Example 1.
Figure 5:
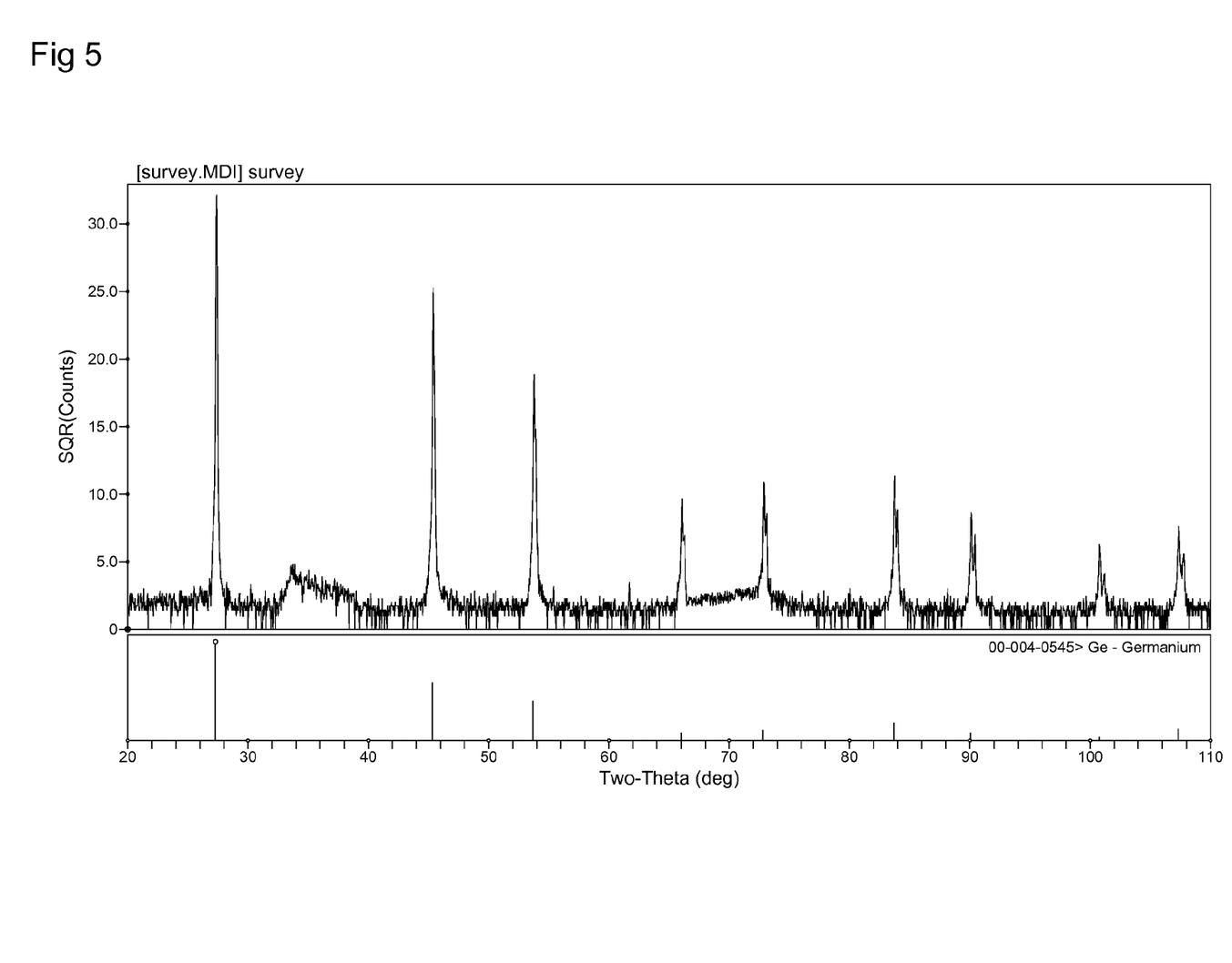
FIG. 5 shows the results of x-ray diffraction analysis of the crystalline germanium powder produced as described in Example 1.
Figure 6:
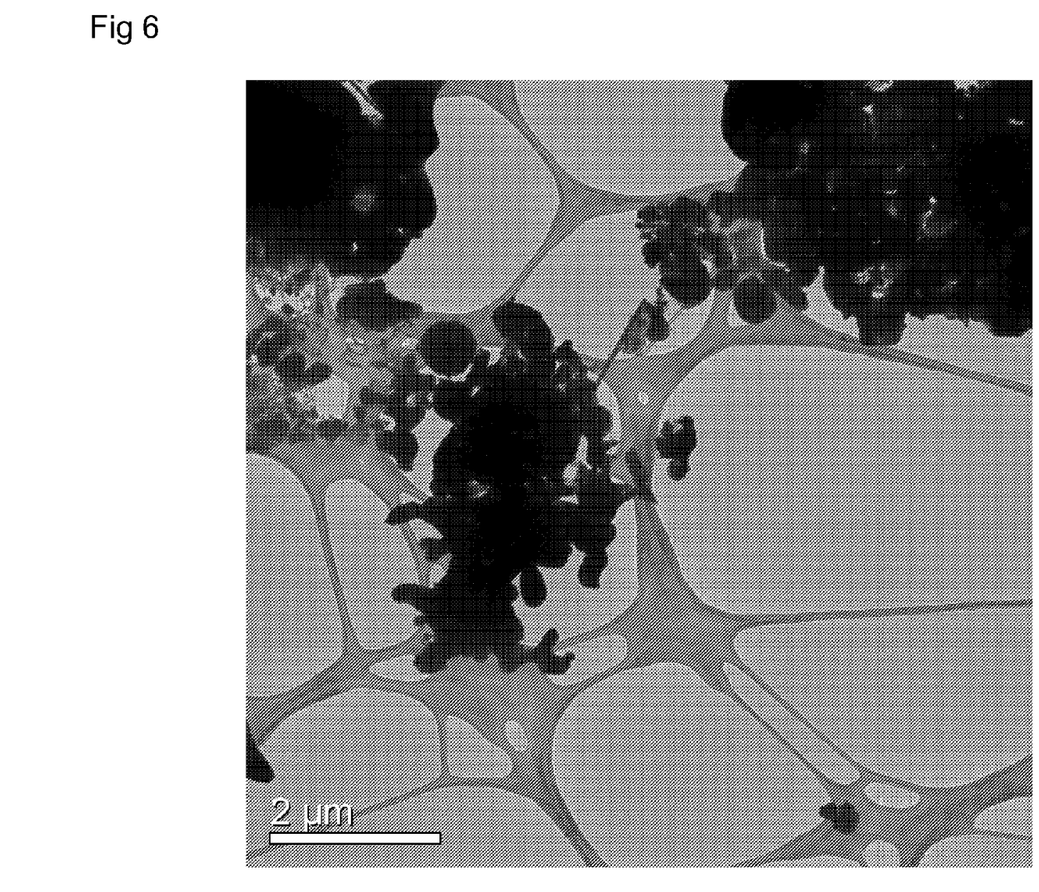
FIG. 6 is a TEM of the crystalline germanium powder produced as described in Example 1.
Figure 7:
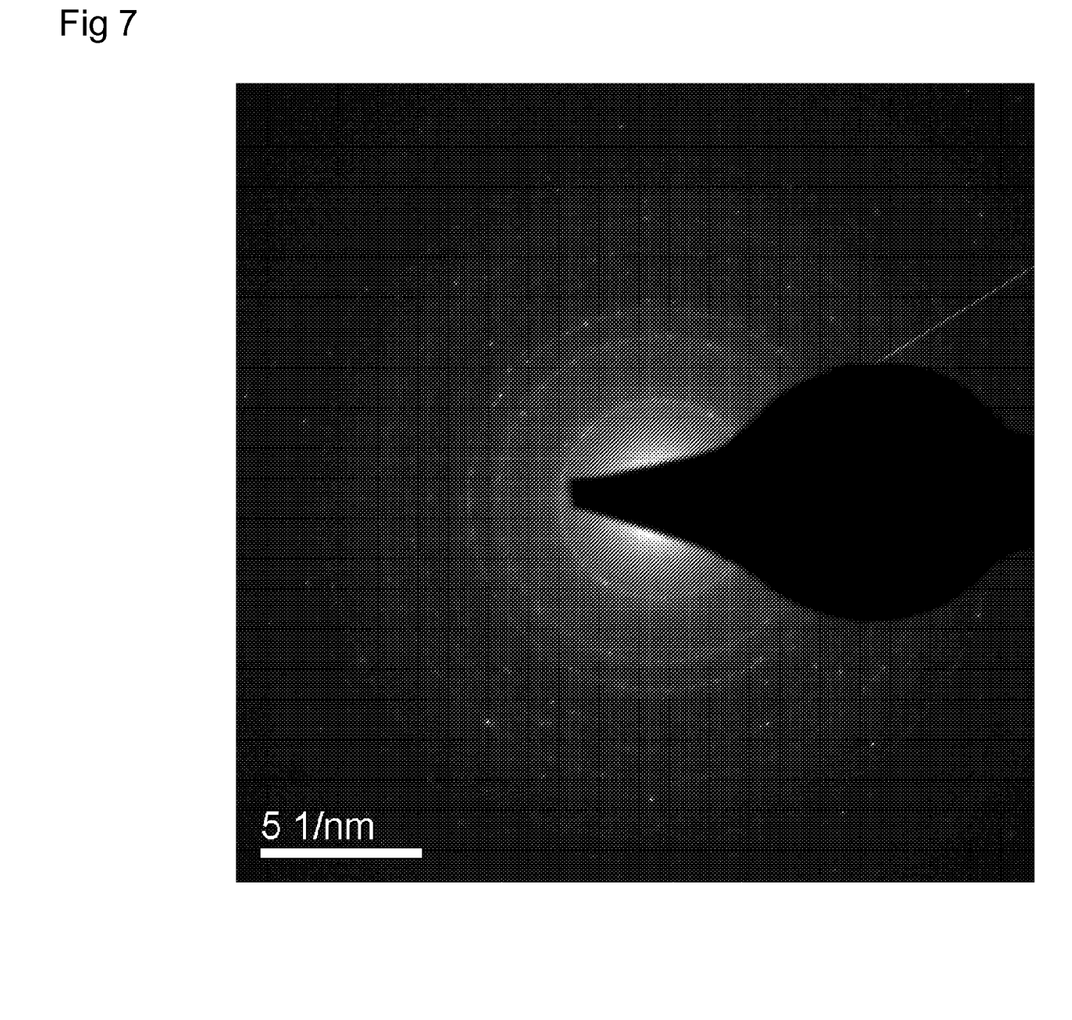
FIG. 7 is a TEM electron diffraction pattern demonstrating the presence of crystalline portions in the imaged sample of the germanium powder produced as described in Example 1.
Figure 8:
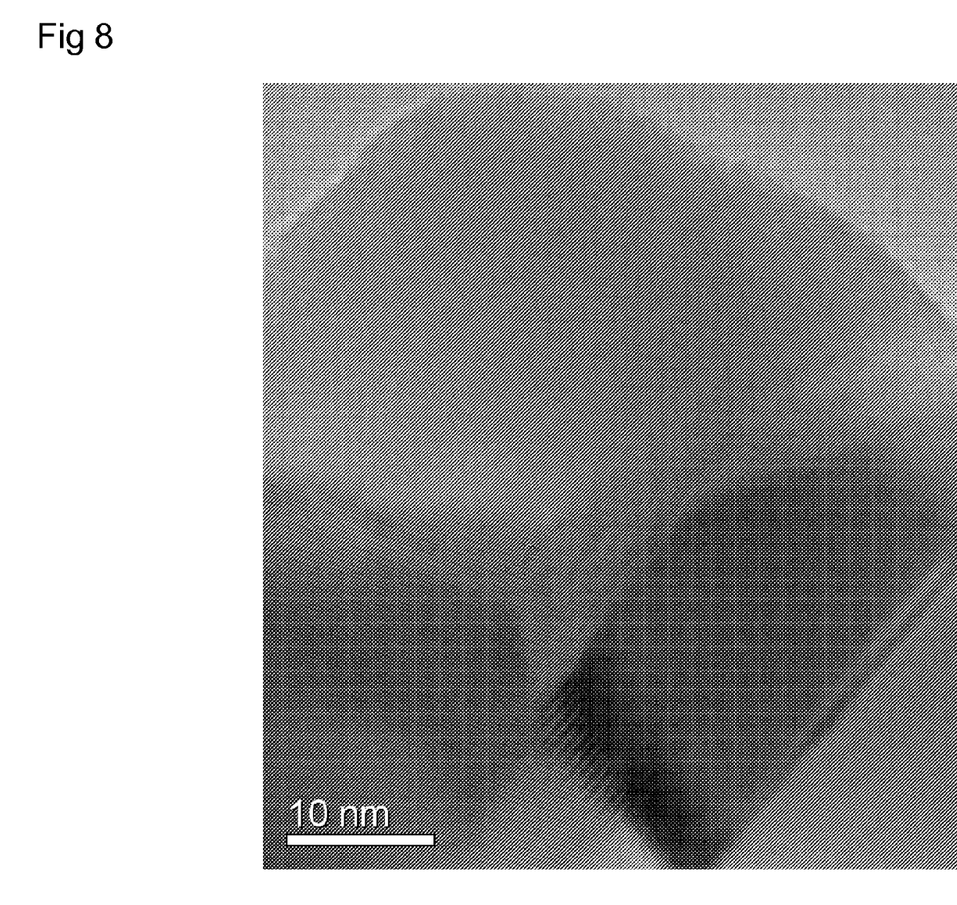
FIG. 8 is a TEM image showing the presence of fringes from crystalline planes in the imaged sample of the germanium powder produced as described in Example 1.

SEM images (FIG. 4) show the formation of particles of Ge. XRD characterization (FIG. 5) shows the presence of crystalline germanium. TEM imaging and electron diffraction (FIGS. 6, 7, and 8) show the presence of nanoparticles of crystalline germanium.

A number of embodiments of the invention have been described. Nevertheless, it will be understood that various modifications may be made without departing from the spirit and scope of the invention. Accordingly, other embodiments are within the scope of the following claims.

What is claimed is:

1. A method of producing a powder of germanium comprising:
   a. forming a mixture comprising a germanium precursor powder and a second powder ingredient that will generate an exothermic reaction when heated;
   b. heating the mixture in a closed reactor to a temperature at which the exothermic reaction occurs;
   c. treating the reaction mixture with one or more leaching agents to leach unwanted materials from the reaction mixture; and
   d. isolating the powder of germanium.

2. The method of claim 1 wherein the germanium produced is crystalline.

3. The method of claim 1 wherein the germanium produced is a fine, ultrafine, or nanoscale powder.

4. The method of claim 1 wherein said germanium precursor is germanium dioxide.

5. The method of claim 1 wherein said second ingredient is magnesium.

6. The method of claim 1 further comprising the step of adding an inert material to the reaction mixture to control the reaction temperature.

7. The method of claim 6 wherein said inert material is NaCl.

8. The method of claim 6 wherein said inert material is MgO.

9. The method of claim 1 wherein said leaching agent is an acid.

10. The method of claim 9 wherein said acid is selected from the group consisting of HCl and acetic acid.

11. The method of claim 1 where a doping agent is included in the reaction mixture.

12. The method of claim 11 wherein the doping agent is included in one or more of the germanium precursor and the second ingredient.

13. The method of claim 1 wherein said germanium product has an average particle size less than 10 microns.

14. The method of claim 1 wherein said germanium product has an average particle size less than 100 nm.

15. The method of claim 1 further comprising the step of forming a dispersion of the germanium powder in a liquid carrier.

16. The method of claim 15 further comprising the step of applying the dispersion to a substrate.

17. The method of claim 15 further comprising treating the powder with an agent to remove oxides prior to formation of the dispersion.

18. The method of claim 1 further comprising the step of doping the germanium powder after it has been formed.

19. The method of claim 18 further comprising the step of doping the powder after deposition on a substrate.

20. The method of claim 1 further comprising maintaining the temperature of the exothermic reaction below the melting temperature of the germanium product.

* * * * *